(12) United States Patent
Biester et al.

(10) Patent No.: US 8,619,434 B2
(45) Date of Patent: Dec. 31, 2013

(54) ARRANGEMENT SYSTEM

(75) Inventors: Klaus Biester, Wienhausen (DE); Peter Kunow, Berlin (DE); Volker Zabe, Burgdorf (DE)

(73) Assignee: Cameron International Corporation, Houston, TX (US)

( * ) Notice: Subject to any disclaimer, the term of this patent is extended or adjusted under 35 U.S.C. 154(b) by 436 days.

(21) Appl. No.: 12/867,540

(22) PCT Filed: Feb. 12, 2009

(86) PCT No.: PCT/EP2009/001011
§ 371 (c)(1),
(2), (4) Date: Sep. 22, 2010

(87) PCT Pub. No.: WO2009/100914
PCT Pub. Date: Aug. 20, 2009

(65) Prior Publication Data
US 2011/0019385 A1     Jan. 27, 2011

(30) Foreign Application Priority Data

Feb. 13, 2008  (DE) ............... 20 2008 001 968 U
Feb. 20, 2008  (DE) ............... 20 2008 002 312 U

(51) Int. Cl.
*H05K 7/02*     (2006.01)

(52) U.S. Cl.
USPC .................. 361/807; 361/748; 361/809

(58) Field of Classification Search
USPC ......... 361/807, 679.01, 809, 810, 811, 812, 361/748, 760, 761, 790; 174/520, 760, 250; 257/678, 731, 732
See application file for complete search history.

(56) References Cited

U.S. PATENT DOCUMENTS

| 4,225,900 A | 9/1980 | Ciccio et al. |
| 4,912,601 A * | 3/1990 | Seipler .................. 361/707 |
| 4,922,381 A | 5/1990 | Longerich et al. |

(Continued)

FOREIGN PATENT DOCUMENTS

| GB | 2338348 A | 12/1999 |
| WO | 03026111 A2 | 3/2003 |
| WO | 03026115 A2 | 3/2003 |

OTHER PUBLICATIONS

PCT/EP2009/001011 International Search Report and Written Opinion, Sep. 8, 2009 (12 p.).

*Primary Examiner* — Jinhee Lee
*Assistant Examiner* — Dimary Lopez
(74) *Attorney, Agent, or Firm* — Chamberlain Hrdlicka

(57) ABSTRACT

An arrangement system composed of a plurality of electrical/electronic components particularly of a voltage converter device of a power supply system for use in oil/natural gas production composed of at least one support member that is provided on at least one side with a surrounded accommodating recess, a circuit carrier which is arranged in the accommodating recess and electrically connected to the components, and a holding member fixing the circuit carrier and/or the components in the accommodating recess. An insulating material is arranged at least in part between the circuit carrier and/or components and the support member. Such an arrangement system permits an adequate electrical insulation of the corresponding components and optionally also of the circuit carrier in relation to the support member together with an adequately high heat conduction. At the same time an arrangement system for components is provided that is mechanically stable and permits a good electrical insulation of the components with heat transfer to the outside with respect to the arrangement system.

23 Claims, 8 Drawing Sheets

(56) References Cited

U.S. PATENT DOCUMENTS

| | | | |
|---|---|---|---|
| 5,016,138 A * | 5/1991 | Woodman | 361/688 |
| 5,579,207 A * | 11/1996 | Hayden et al. | 361/790 |
| 5,701,233 A * | 12/1997 | Carson et al. | 361/735 |
| 5,966,291 A | 10/1999 | Baumel et al. | |
| 6,181,567 B1 * | 1/2001 | Roemer et al. | 361/760 |
| 6,476,476 B1 * | 11/2002 | Glenn | 257/686 |
| 6,731,514 B2 * | 5/2004 | Evans | 361/790 |
| 7,511,967 B2 * | 3/2009 | Loda | 361/790 |
| 7,646,612 B2 * | 1/2010 | Duarte et al. | 361/799 |
| 2002/0141150 A1 | 10/2002 | Huber et al. | |

* cited by examiner

ARRANGEMENT SYSTEM

CROSS-REFERENCE TO RELATED APPLICATIONS

The present application is a U.S. National Phase filing under 35 U.S.C. §371 for PCT/EP2009/001011, filed on Feb. 12, 2009, which claims the benefit of German Patent Application Serial Number 20 2008 001 968.0, filed on Feb. 13, 2008 and German Patent Application Serial Number 20 2008 002 312.2, filed on Feb. 20, 2008, the disclosures of which are incorporated herein by reference.

STATEMENT REGARDING FEDERALLY SPONSORED RESEARCH OR DEVELOPMENT

Not applicable.

SUMMARY

The present invention relates to an arrangement system for a plurality of electrical/electronic components, particularly of a voltage converter device of a power supply system for use in oil/natural gas production, comprising at least one support member that is provided on at least one side with a surrounded accommodating recess, a circuit carrier which is arranged in the accommodating recess and electrically connected to the components, and a holding member fixing the circuit carrier and/or the components in the accommodating recess, wherein an insulating material is arranged at least in part between circuit carrier and/or components and the carrier member.

A corresponding power supply system is described in WO 2003/026115 or WO 2003/026111. A corresponding voltage converter device is connected at the input side to a dc voltage source and at the output side it outputs a converted dc voltage to at least one electrical consumer via a cable connection. The corresponding converter device comprises a plurality of dc voltage converter modules, of which each is connected at the input side in series with the dc voltage source and at the output side in parallel with the cable connection for providing the converted dc voltage. For instance, with the converter device a dc voltage amounting to a few kV is each time converted into a few 1000 V by each of the converter modules.

A corresponding arrangement system is suggested for arranging corresponding electrical or electronic components, such as diodes, IGBT, MOSFET, or the like, which are needed for implementing such converter modules in combination with a circuit. In a support member of such an arrangement system, the corresponding components and an associated circuit carrier are arranged in an accommodating recess. For fixing the components and the circuit carrier, respectively, a holding member is used that fixes components and/or circuit carriers in the accommodating recess. To prevent electrical breakdown between circuit carrier and particularly the electrical/electronic components, an insulating material is arranged between circuit carrier and/or components and the support member. At the same time said insulating material serves the heat transfer particularly from the components to the support member, said support member being then able to output the heat to the outside.

According to the above-mentioned international applications the voltage converter device is arranged below sea level. It is normally installed in a so-called subsea tree and serves to power corresponding units of the tree, such as valve, choke, or the like. The corresponding arrangement system is normally also part of the subsea tree; in this instance, heat is directly output from the support member to the ambient seawater.

Since the support member is substantially grounded in this way, an adequate electrical insulation of the corresponding components and optionally also of the circuit carrier in relation to the support member together with an adequately high heat conduction is the object of the present invention.

Furthermore, it is the object of the present invention to provide an arrangement system for components that is mechanically stable and simultaneously permits an adequately good electrical insulation of the components together with an adequate heat transfer to the outside relative to the arrangement system.

To be able to accommodate an adequate number of components in the arrangement system, the support member can comprise, at both sides, accommodating recesses arranged in the upper and lower side. Each of said accommodating recesses has then arranged therein in a corresponding manner a circuit carrier with associated components as well as a holding member, and an electrical insulation preferably of the components is also provided by the insulating material in relation to the support member.

The arrangement of the corresponding components, see the above-mentioned international applications, can be similar in each of the accommodating recesses to permit the corresponding serial arrangement of the individual converter modules of the voltage converter devices of the power supply system.

To enable, in particular, a good heat output to a medium surrounding the arrangement system, said medium preferably has a substantially circular cross-section. The surface is thereby relatively large and a high heat output is possible. This is particularly true for direct heat output to seawater, as has been explained above.

In conformity with the circular configuration of the arrangement system, the support member is here also made circular in a corresponding way with a corresponding circular accommodating recess in which circular or ring-shaped circuit carriers and holding members can then be arranged.

To protect the arrangement system particularly in the area of the components and the circuit carrier against penetration by the external environment, the accommodating recess can be closed in a fluid-tight manner.

A simple embodiment of a circuit carrier is a board with a correspondingly printed-on circuit.

In such a board or in a corresponding circuit carrier the components are preferably arranged thereon and/or at least electrically connected thereto. Said electrical connection is established via electrical lines soldered to connection points of a printed-on circuit.

One option for an insulating material is an electrically insulating casting material. Such a casting material is e.g. cast into the accommodating recess; subsequently, circuit carrier and/or components is/are arranged and said members are then fixed by the holding member. The casting material will normally cure, thereby serving the electrical insulation and also the fixation of the corresponding members relative to the support member.

A casting material is e.g. an epoxy resin which, depending on the thickness, shows a corresponding dielectric strength in the range of several 100 V up to a few kV. At the same time such an epoxy resin shows a heat transfer coefficient that is normally greater than $0.1 \ W/m \times K$.

With such a casting material attention must be paid that said material should be relatively thick to achieve a high dielectric strength and it should be relatively thin at the same time to permit a high heat transfer. To satisfy these contrary demands, a corresponding compromise must be found for the thickness of the casting material. At the same time, the casting material must normally be degassed, and corresponding curing times are also needed for maintaining an adequate mechanical strength before the further assembly of the arrangement system.

Attention must also be paid in the case of the casting material that said material must be removed in case of damage with the help of corresponding mechanical processes, which will then normally lead to the destruction of the components and possibly of the circuit carrier. Such a case of damage is e.g. an electrical breakdown or a crack in the cured casting material.

While maintaining an adequate electrical insulation and a good heat transfer at the same time, it is also conceivable to use an electrically insulating sheet as the insulating material. An example of such a sheet is a ceramic sheet. As a rule, said sheet exhibits a dielectric strength even higher in comparison with the casting material and also a higher heat transfer coefficient. For instance, there are corresponding ceramic sheets that at a thickness of about one mm withstand a breakdown voltage of 10 or more kV and simultaneously have a heat transfer coefficient of more than 5 W/m·K. These represent even more advantageous values in comparison with the above-mentioned casting compound.

When the arrangement system is given a circular shape with a correspondingly circular or ring-shaped accommodating recess of the support member, the sheet may be configured as a corresponding ring sheet that is inserted into the accommodating recess.

As a rule, an arrangement of the sheet at least in part between underside of the circuit carrier and/or underside of each component and surface of the accommodating recess is enough. In the area of the components maximum voltage values are observed, so that an arrangement of the sheet is only possible between underside of each component and surface of the accommodating recess.

In principle it is possible to give the sheet a varying thickness in conformity with the arising voltage values. For the sake of simplification, however, the sheet has a substantially constant sheet thickness. This thickness is then chosen to be so great that the electric strength for the normally arising voltage values is given for each component. To permit a corresponding heat transfer coefficient for the sheet for an adequate discharge of heat to the support member, the sheet may be formed of a material showing a high heat transfer coefficient.

For a simplified arrangement and removal of the sheet, the latter may be inserted without gluing into the accommodating recess.

To ensure an adequate electric strength particularly also in the area of a corresponding recess edge of each accommodating recess, the sheet may be arranged in the accommodating recess particularly up to the recess edge. It can extend therefrom radially inwards as a sheet ring, with the corresponding components being preferably arranged in the sheet ring.

It has already been pointed out that with a corresponding use of the arrangement system according to the invention the support member is in direct contact with seawater with its outer surface. To considerably reduce or eliminate corrosion in this connection, the support member can be made from a particularly seawater-resistant material, such as bronze or the like.

To enable the holding member to fix components and, if necessary, circuit carriers in a simple way, the holding member may be a pressing member connected to the support member particularly by way of screwing. Depending on the tightening of the screws, a more or less strong fixation of the corresponding members by the holding member is accomplished, the holding member being particularly adapted to press the components onto the insulating material and particularly onto the surface of the corresponding sheet.

As a rule, pressure must only be exerted in the area of the sheet, so that a ring-shaped holding member is normally enough. Said member extends e.g. in the area in which the sheet or ring sheet, respectively, is also arranged.

A holding member that also exhibits a corresponding dielectric strength may be a holding member made of a fiber composite, particularly of paper with phenolic plastic. Phenolic plastic is a phenol-formaldehyde resin and, as a fiber composite with paper, it is also called hard paper.

To be able to fasten the holding member in a simple and appropriate way to the support member, there is the possibility that a plurality of screws are arranged for fastening the holding member to the support member particularly along a circumference of the holding member.

It has already been pointed out that an arrangement of the corresponding insulating material also in the form of the sheet or the ring sheet, respectively, in the area of the components may possibly be regarded as adequate. However, there is also the possibility that the insulating material or the foil also extends between circuit carrier and corresponding surface of the accommodating recess.

To be able to exert pressure, if necessary, by means of the holding and/or pressing member directly on a corresponding component and to provide enough space for the arrangement of connection lines or wires at the same time, the holding member may be equipped on its underside facing the components with a plurality of press surfaces and/or accommodating recesses. The pressing surfaces may be provided in conformity with the arrangement of the components and press from above onto an upper side of the components when the holding member is fastened by means of the above-mentioned screw. As a rule, the pressing surfaces are here smaller than a corresponding surface of a component. Furthermore, the accommodating recesses serve to accommodate corresponding connection lines between e.g. a component and the circuit carrier.

To ensure in this connection that the holding member is assigned to the components and the circuit carrier quite accurately during assembly of the arrangement system, the holding member may comprise at least one insertion opening for an orienting means for orienting a component. Prior to the assembly of the arrangement system said orienting means fixes the corresponding component relative to the holding member, thereby ensuring a corresponding assignment particularly of pressing surface and accommodating recess, respectively, and the component.

A simple orienting means, which is electrically insulating at the same time, is e.g. an orienting pin made of a plastic material.

When the holding member is screwed on relative to the support member, it may be of further advantage when holding member and support member have arranged thereinbetween, at least in the area of the fastening screw, intermediate rings that are compressible during the screw-on process. It is here for instance possible that such an intermediate ring is made of a compressible plastic material. Such a plastic material is e.g. polyurethane of low hardness.

To be able to arrange the components relative to the circuit carrier at a corresponding place and in a simple way, the circuit carrier may comprise component openings and/or component cutouts open towards its outer edge. The corresponding components, such as diodes, MOSFETs, or the like, can then be arranged in said openings or cutouts. An electrical connection is established from said arrangement of the components to corresponding connection points of the circuit carrier via wires and associated solders.

It may be enough when the holding member is configured as a circumferential ring fixing the circuit carrier at least in part along a circumference. Either the circuit carrier is thereby fixed directly or an intermediate ring, or the like, which holds the circuit carrier, is fixed thereby. In this context the components are normally arranged outside the corresponding circumferential ring, so that said ring is at least without any component openings.

To seal the accommodating recess in relation to the environment, a lid member which closes the accommodating recess may be arranged above circuit carrier and/or holding member. Said lid member is e.g. connectable in fluid-tight fashion by screwing to the support member. Other ways of fastening between lid cover and support member are possible.

A corresponding closing of the accommodating recess is not needed for each support member if these are stacked in superposed fashion. The superimposed support members thereby seal at least the accommodating recesses arranged thereinbetween or only the uppermost or lowermost outwardly open accommodating recess is closed by a corresponding lid member in a fluid-tight member. With a correspondingly stacked arrangement of the support members it may also turn out to be advantageous when the corresponding members are supported in puncture-proof fashion inside an accommodating recess of a support member in relation to the corresponding members in the support member stacked thereabove. This can e.g. be accomplished in that the holding member is configured as a cover member covering the accommodating recess at least in part. Such a cover member advantageously covers at least conductive members inside the associated accommodating recess, so that these cannot generate any disruptive discharge to corresponding conductive members in the superimposed accommodating recess of the correspondingly stacked support member. It is in this connection possible to cover each of these accommodating recesses by means of a corresponding cover member.

As a rule, support members are stacked in such a number that an adequate quantity of converter modules of the voltage converter device for converting a voltage amounting to a few 1000 V into voltages amounting to a few 100 V is provided. For instance, if a voltage of 3 kV is applied to the arrangement system on the whole and if voltages in the order of 300 V are needed for the corresponding devices, ten voltage converter devices may e.g. be present in the arrangement system. Each support member comprises a converter module in each of its accommodating recesses, so that with the previous numerical example a total of five support members of that type are superposed and stacked.

An easy stackability of the corresponding components can e.g. be accomplished in that these components are stackable by means of their recess edges surrounding the accommodating recesses. Only the corresponding recess edges of the superposed support members are thereby stacked up to the necessary number of support members with corresponding circuit carriers, accommodating recesses, holding members and components.

A simple shape of a recess edge which enables easy stacking can be seen in the feature that the support member in the area of its recess edge has substantially a cross section in the form of a lying T. The ends of the T-shaped cross web then serve as a stacking surface.

It is also possible to orient and fasten the components directly and without the aforementioned orienting means relative to the support member. Such a possibility can be seen in the feature that the support member comprises at least one electrically insulating screw-on opening for fastening to the support member particularly by means of a screw.

The electrical insulation of the screw-on opening can e.g. be accomplished in that a sleeve of an electrically insulating material is inserted into said opening. This prevents contact between the screw and the component. The sleeve is here sufficiently puncture-proof.

Furthermore, it may here be of advantage when the sleeve extends at least up and into the insulating material or the corresponding sheet.

To avoid any direct contact with the component also when the screw is further tightened, the sleeve may comprise a sleeve edge resting on the component. Said edge will then serve as a counter bearing for a screw head.

It is also possible to fasten the components and optionally also the circuit carrier separately; for this purpose e.g. the components and optionally the circuit carrier are here fastened particularly detachably to an intermediate plate arranged between holding member and insulating material or sheet, respectively. The intermediate plate can then be fixed by a correspondingly shaped holding member or pressing member relative to the support member. Also in this connection a ring-shaped holding and/or pressing member arranged along the circumference of the corresponding intermediate plate is here adequate as a rule.

Also for such a holding and/or pressing member, fastening via a multitude of screws arranged along the circumference thereof can be carried out.

When a corresponding holding member is used, it is further possible that an adhesive compound is arranged on an underside of the holding member facing the components. Said adhesive compound can serve to fix or also orient the components; in this connection the orienting means could also be omitted.

When a corresponding sheet is used as the insulating material, a further advantage becomes apparent as a rule. The sheet may e.g. be formed from a material which can be reshaped at least in part by pressure and/or heat. Such a material is in particular a corresponding composite ceramic. When a corresponding pressure is then exerted by the holding member or a corresponding temperature is generated during use of the components, this will at least slightly press the components into the upper side of the sheet facing these components, which permits an improved dimensionally stable arrangement of the components. The surface contact between component and sheet for heat transfer is improved at the same time.

Moreover, such a sheet can be flexible, so that it can be easily inserted into the corresponding accommodating recess prior to the arrangement of the further members. The sheet can be cut into its appropriate shape e.g. by means of a water jet.

To protect the interior of the arrangement system not only against penetration of external atmosphere or environment, but also to substantially avoid corrosion in the interior at the same time, the interior of the arrangement system may contain a substantially inert atmosphere. This atmosphere is e.g. entrapped in the interior of the arrangement system by flushing with a corresponding inert gas and sealing the interior for instance by the support members stacked one upon the other and the corresponding lid members. An example of such an inert atmosphere is nitrogen of a corresponding purity.

A further option for an insulating material is an electrically insulating pasty or liquid base material from which the insulating material can be formed also exclusively. Depending on its viscosity, the corresponding base material is arranged by means of a device or by casting into the accommodating recess. Subsequently, the remaining members of the arrangement system are arranged accordingly and said members are then fixed with simultaneous inclusion of the insulating material.

If for example the insulating material formed from the base material shall be further optimized with respect to its property regarding electrical insulation or thermal transfer, the base material may have added a particularly mineral additive in a corresponding amount. Such additives can also influence only one of said properties, such as thermal conductivity or electric strength. It is e.g. conceivable that the insulation property of the insulating material is improved by such an additive. It is also possible that with a non-conductive additive said additive will improve thermal conductivity. It is also thinkable that the corresponding additive improves both thermal conductivity and electric strength of the insulating material.

A further possibility of changing the insulating material and particularly the base material in its properties may e.g. be seen in the feature that the material is variable in its viscosity by varying its solids content. For instance, it is also possible to give a base material that is originally liquid a substantially "pasty" character.

Since the highest voltage values normally arise in the arrangement system in the area of the components, it may turn out to be advantageous when a component carrier is arranged for accommodating the components in the accommodating recess and defines an accommodating chamber for accommodating the insulating material at least at one side and opposite to the support member. The insulating material can thereby be arranged substantially between the component carrier with the components and the support member.

It is possible to arrange the components on a correspondingly electrically insulating component carrier and to connect them to electric circuits that are optionally provided for. The component carrier may here be configured directly as a circuit carrier or board. The components can thereby be arranged also directly on the circuit carrier. A corresponding connection of the components to connection points on the circuit carrier is established via corresponding connection wires. This is also done if circuit carrier and component carrier are separate parts.

To accommodate the corresponding components, it is normally enough when the component carrier is configured as a ring component.

A corresponding component carrier can extend in this connection in the accommodating recess at least in the direction of the recess edge of the support member. However, attention must here be paid that the corresponding accommodating chamber for the insulating material is formed between component carrier and support member or also stiffening edge.

To be able to define the accommodating chamber in a simple way also in the area of the recess edge, the component carrier may extend in part substantially in a direction perpendicular to the surface of the accommodating recess along the recess edge. The corresponding accommodating chamber between component carrier and support member may thereby be defined also along the recess edge.

To be able to guarantee a corresponding distance between component carrier and, for example, surface of the accommodating recess, the component carrier may be supported at its radially inner free end section. This radially inner free end section is arranged in the area of the accommodating recess and is kept by the corresponding support at some distance from the surface of the accommodating recess.

Various measures are feasible for such a supporting measure. For instance, a spacer made of electrically insulating material may be arranged underneath the component carrier. A further supporting possibility may be seen in the measure that a bottom plate is arranged in the accommodating recess. The component carrier rests at least in part on said bottom plate.

It may here be adequate when the bottom plate is configured as a bottom ring on which the component carrier rests at least at some places in a supporting manner along the ring circumference.

To achieve a certain positioning of the component carrier through the support at the same time, the bottom plate may be provided on its upper side with a stop nose for lateral abutment on the component carrier.

To be able to fix the corresponding components in a simple way, these may be detachably fastened to the upper side of the component carrier. Fastening by screwing is e.g. an option for such a detachable attachment.

To ensure a certain thickness of the corresponding insulating material inside the accommodating chamber in response to the requirements, the distance between component carrier underside and surface of the accommodating recess can substantially be constant. The distance defines the thickness of the corresponding insulating material in this respect and thus both the electric strength and the heat transfer.

There is also the possibility that the distance varies depending on the requirements and that a different thickness of the insulating material is possible.

To improve sealing of the accommodating chamber, at least one sealing ring can be arranged substantially at a closed end of the accommodating chamber underneath an end section of the component carrier. A corresponding sealing ring may also be attached to the bottom ring, so that said ring can be arranged together with the bottom ring in the accommodating recess.

The corresponding sealing ring may have a round or angular or also other cross-section.

For volume and/or pressure compensation in the accommodating chamber and particularly in the insulating material arranged therein a hose ring may be arranged substantially along a connection edge of accommodating recess and recess edge. Said ring may be made from a relatively soft material such as silicone or the like. In the interior thereof a corresponding pressure can prevail that upon expansion of the insulating material can absorb a corresponding pressure for volume and/or pressure compensation through the compressibility thereof.

To be able to fasten the component carrier in a simple way, a holding member may be arranged between said carrier and the support member for fixing the component carrier. Moreover, said holding member may define the accommodating chamber at an end opposite the bottom ring. A sealing ring may also be arranged in this area of the accommodating chamber end.

One option for such a holding member may be seen in the feature that said member has assigned thereto a radially outer end section of the component carrier. Said outer end section can then be fixed by means of the holding member to the support member or the recess edge thereof. The corresponding fixing operation can be carried out via a number of screws, or the like.

To be able to use the holding member in a simple way, said member may particularly be configured as a multipart member. The ring members are inserted separately and fastened by means of e.g. the above-mentioned screws with simultaneous fixation of the component carrier.

To be able to arrange the holding member in a specific position in an easier way in addition to a fixation to the support member for instance via screws, the holding member may comprise a plug projection that can be inserted into a plug groove on the inside of the recess edge. Said plug projection can extend over the whole circumference of the holding member. It is also possible that said member is only provided at places along the circumference in a corresponding way for forming the plug projection at places. Likewise, it is possible that the corresponding plug groove extends along the whole circumference when the plug projection is arranged at places.

A simple way of assigning plug projection and plug groove can be seen in the feature that the plug projection has a substantially angular, particularly square or rectangular, cross-section. As a rule, the plug groove has a complementary cross-section.

With such a mounting of the holding member directly on the support member, it can be regarded as appropriate when the holding member is only fixed to the component carrier in a detachable way, with screws, for example, being useable for such a fixation.

It may turn out to be advantageous when also after the arrangement of already all of the members of the arrangement system it is possible to arrange further insulating material or only then the insulating material in the corresponding accommodating chamber. This can particularly be accomplished in that closable venting and/or filing openings are formed at least in the component carrier. A corresponding filling opening may serve the introduction of insulating material into the accommodating chamber. A further venting opening may here permit the exit of air or the like out of the accommodating chamber during filling with additional insulating material.

A flat ring holding component, which extends for example as a circumferential ring along an outer circumference of the holding member, is normally adequate for a holding member.

It is also possible that the holding member grips from the inside of the recess edge over a corresponding end section of the component carrier that is assigned to the recess edge. In both examples the holding member also serves as a boundary for the accommodating chamber at its corresponding end.

A simple possibility of forming a multipart holding ring or a multipart holding member can be seen in the feature that it comprises two ring sections and two tapered ring sections which can be arranged thereinbetween substantially in diametrically opposite fashion. The two ring sections are first inserted into the accommodating recess, if necessary with simultaneous insertion of plug projection into plug groove, and are arranged on the support member. Subsequently, the tapered ring sections are inserted and all sections are then fastened accordingly for instance by being screwed onto the component carrier.

To close a corresponding accommodating recess relative to a further support member and the accommodating recess arranged there, a cover member may be arranged to close the accommodating recess above the holding rings. Such a cover member may be made from a similar material as the component carrier or the circuit carrier, e.g. from a fiber composite, particularly of paper and phenolic plastic. Phenolic plastic is a phenol-formaldehyde resin and, as a fiber composite with paper, it is also called hard paper. The other members, such as holding member and bottom ring, may be made from an electrically insulating plastic material, such as polyurethane or the like.

When corresponding venting and/or filling openings are used, a corresponding closing of said openings is needed as a rule. This can be accomplished through a particularly self-sealing screw that can be screwed into the venting and/or filling opening or arranged to at least close the same.

To be able to arrange a number of corresponding components and circuit carriers for forming e.g. a plurality of voltage converter devices, each support member may comprise an upper and a lower accommodating recess. The corresponding members, such as component carrier, circuit carrier, holding member, bottom ring and the like with accompanying components, are then arranged in each accommodating recess.

In this context it is further of advantage when the support members are particularly stackable by means of the recess edges surrounding the accommodating recesses. It is thereby possible to stack enough support members one upon the other until the required number of support members with corresponding circuit carriers, accommodating recesses, holding members and components is achieved.

To simplify the stacked configuration and also simultaneously to protect the corresponding components in a certain way against an external atmosphere surrounding the arrangement system, the recess edges of support members stacked one on top of the other may be configured to be insertable into one another partly with their ends facing each other.

To be able to fasten the support members stacked one on top of the other to each other, the recess edge may comprise at least one stack bore passing therethrough in stacking direction. The stack bores of all recess edges stacked one on top of the other are in alignment with one another and can be fastened by way of a long screw connection or a screw bolt to one another.

In a further embodiment of the arrangement system, an intermediate ring may be arranged between pressing and/or holding ring and intermediate ring or component carrier. Said intermediate ring is made from an insulating material and prevents direct contact between pressing and/or holding ring and intermediate ring or component carrier.

In this connection the intermediate ring which can be detachably fastened to the end section of the intermediate ring or component carrier may serve to fasten the intermediate ring or component carrier. The corresponding fastening can be carried out by means of a screw, or the like, which is advantageously not in contact with the pressing and/or holding ring.

To prevent direct contact between intermediate ring or component carrier and the recess edge, the intermediate ring or component carrier may be arranged spaced apart from the inside of the recess edge with formation of an accommodating chamber. The spaced arrangement may here be formed by way of fastening to the corresponding intermediate ring.

The accommodating chamber may be partly evacuated if necessary and/or filled with an inert gas. It is already in this instance that the accommodating chamber has a relatively high electric strength. This strength can even be enhanced if an insulating material is arranged in the accommodating chamber.

In a simple embodiment the insulating material can fill the accommodating chamber so that it also supports the arrangement of the intermediate ring and component carrier, respectively. At the same time said insulating material can produce a certain vibration damping action because it is substantially arranged as a buffer between recess edge and intermediate ring and component carrier, respectively.

The intermediate ring and component carrier, respectively, can be arranged to be displaceable so as to compensate for instance for thermal differences between the components by way of such displaceability. With a corresponding fastening of the intermediate ring to the intermediate ring and component carrier, respectively, it can move together with the intermediate ring and component carrier, respectively.

A simple possibility of arranging the corresponding insulating material can be seen in the measure that the insulating material is configured as a coating of recess edge and/or intermediate ring and component carrier, respectively. To accomplish an insulation of the intermediate ring and component carrier, respectively, in a simple way in relation to the accommodating recess, an at least one-layered insulating material layer/sheet may be arranged between intermediate ring and component carrier, respectively, and surface of the accommodating recess.

For the further arrangement of other components the accommodating recess may substantially comprise a rebound recess. A fiber optic plate, a aramid fiber plate or other fiber glass plate can e.g. be arranged in said recess.

To be able to also insulate the same in a corresponding way, an edge insulating material may be disposed between fiber glass plate and insulating layer/sheet particularly along an edge of the rebound recess. Advantageously, edge insulating material and insulating material may be formed in the accommodating chamber of the same material. Such a material is e.g. silicone.

A possible material for the intermediate ring and component carrier, respectively, is e.g. aluminum oxide.

BRIEF DESCRIPTION OF THE DRAWINGS

Advantageous embodiments of the invention shall now be described in more detail with reference to the figures attached in the drawings, of which.

DETAILED DESCRIPTION

Figure 1:
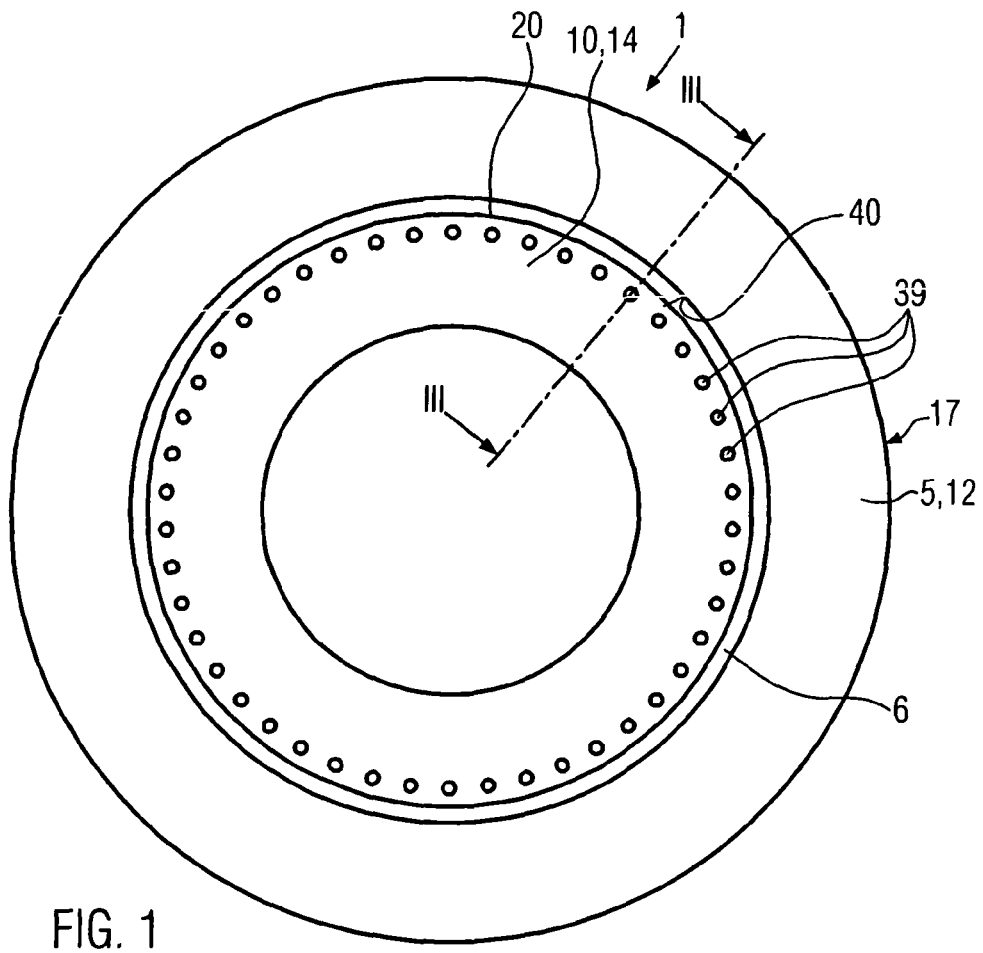
FIG. 1 is a top view on a support member of an arrangement system according to the invention with inserted insulating sheet.
Figure 6:
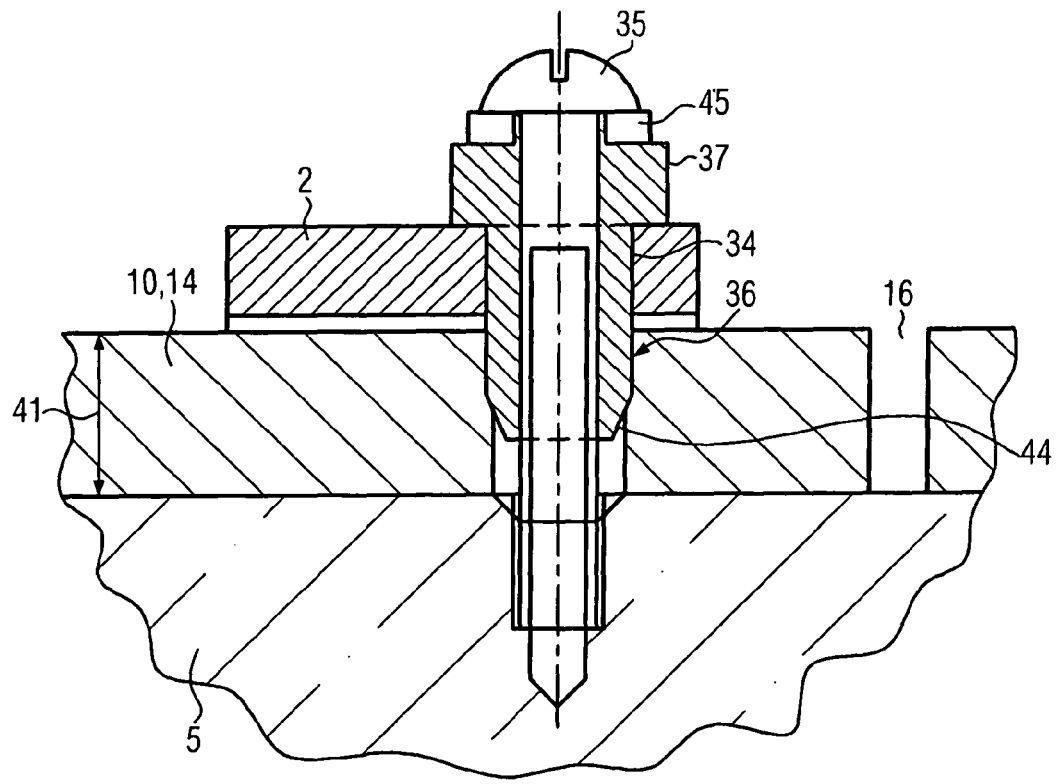
FIG. 6 is an enlarged section of FIG. 5.

FIG. 1 is a top view on an arrangement system 1 according to the invention with at least one support member 5 and a sheet 14 which is inserted into an accommodating recess 6 of the support member 5 and is of a normally constant sheet thickness 41, see FIG. 6, as an insulating material 10. The arrangement system 1 has a circular cross-section, the sheet 14 being arranged as a ring sheet in the corresponding circular accommodating recess 6 of the support member 5. A plurality of bores 39 are arranged along a circumference 20 of the ring sheet 14, see also FIGS. 3 and 4, which serve to fasten a holding member (not shown) on the support member 5. As a rule, the ring sheet 14 extends up to an inside 40 of a recess edge 17 surrounding the accommodating recess 6.

Further parts of the arrangement system 1 are not yet arranged in FIG. 1; see the subsequent figures. Like members are each time provided with like reference numerals, said members being partly only explained in more detail in connection with one figure.

Figure 7:
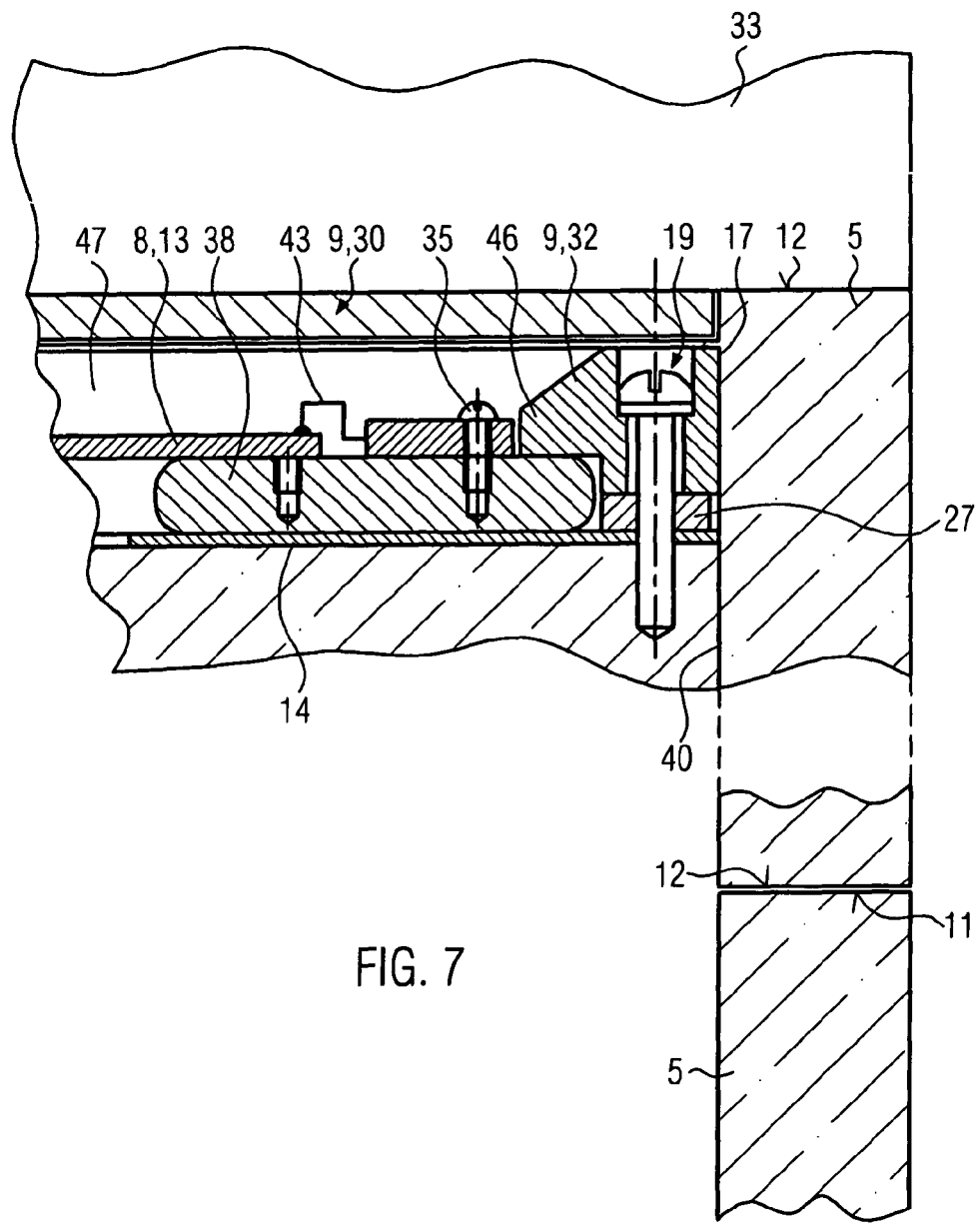
FIG. 7 is a section analogous to the preceding figures for a further embodiment.

The arrangement system 1 consists of a plurality of corresponding support members with accommodating recesses and further components arranged therein, which, see also FIG. 7, are stacked one upon the other. Each individual support member has assigned thereto a converter module of a voltage converter device, of which several are connected in series with a line for the supply of an input voltage. The input voltage is a few kV, each of the converter modules converting part of said input voltage into an output voltage with a lower voltage value. For instance, at an input voltage of 3 kV, ten converter modules of such type are arranged, of which each outputs an output voltage of about 300 V. According to one embodiment of the invention a support member 5 serves the arrangement of two converter modules (see also FIG. 3), with one converter module being arranged in one accommodating recess 6, 7 at a time.

Figure 2:
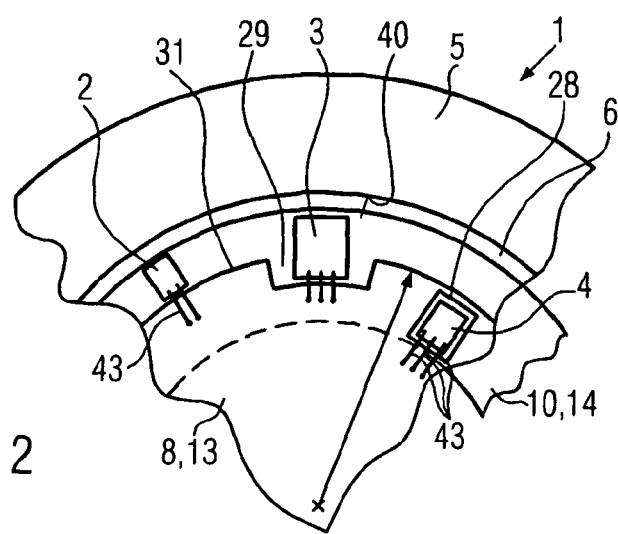
FIG. 2 is a detail view according to FIG. 1 with additional circuit carrier and components.

FIG. 2 shows a detail according to FIG. 1 of the arrangement system 1 with additional components 2, 3 and 4 and a circuit carrier 8. The corresponding sheet ring 14 as the insulating material 10 is also shown only in part in comparison with FIG. 1. Said sheet ring 14 extends underneath and between the components 2, 3, 4 and (see also FIG. 3) a surface 16 of the corresponding upper accommodating recess 6. The various components 2, 3, 4 are e.g. a diode, particularly Z-diode, a MOSFET or also an IGBT, the MOSFET standing for metal oxide semiconductor field-effect transistor and IGBT for insulated-gate bipolar transistor.

The corresponding components 2, 3, 4 are not arranged directly on the circuit carrier 8 in the form of e.g. a board 13. Instead of this, they are arranged in corresponding component openings 28 and component cutouts 29 of the circuit carrier 8. The corresponding component cutout 29 is open towards the circumference 31 of the circuit carrier 8.

The further component 3 is arranged between said circumference 31 and the inside 40 of the support member 5 in the accommodating recess 6. A number of connection wires 43 serve each the electrical connection of the component 2, 3 and 4, respectively, with corresponding connection points on the board 13 and on the circuit carrier 8, respectively.

Figure 3:
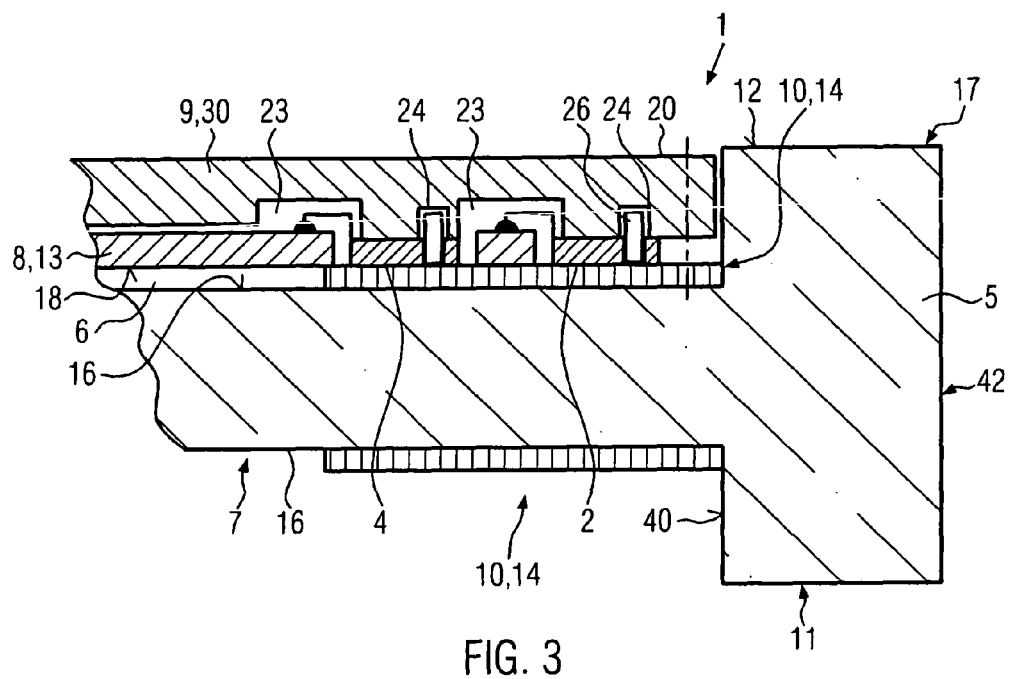
FIG. 3 is a section taken along line of FIG. 1 with a holding member in addition.

FIG. 3 is a section taken along line III-Ill of FIG. 1 with additional holding member 9 in the accommodating recess 6. As can particularly be seen in FIG. 3, the support member 5 has an upper and a lower accommodating recess 6, 7, so that a total of two of the above-mentioned converter modules can be arranged per support member 5.

Further possibilities of arrangement for such converter modules are conceivable, as e.g. only an arrangement of one converter module in a support member 5 with only one upper or lower accommodating recess 6, 7.

In the area of the recess edge 17 the support member 5 has a cross section of a lying T, the ends of the T-shaped cross web forming a lower side 11 and an upper side 12, which (see also FIG. 7) serve to stack further support members 5.

In the upper accommodating recess 6 the corresponding components 2, 3 and 4 (see also FIG. 2) are arranged and connected to the board 13 and the circuit carrier 8, respectively, via corresponding connection wires 43. Underneath the components the ring sheet 14 is arranged as insulating material 10 between the component undersides 15 and the surface 16 of the corresponding accommodating recess 6. The ring sheet 14 is inserted without any gluing into the accommodating recess 6 and formed substantially of an elastic composite ceramic material of a high electric strength and high heat transfer coefficient. In a corresponding composite ceramic material, the electric strength may e.g. be several kV at a sheet thickness of one mm, with values of up to 20 and more kV being also possible. At the same time such a ring sheet shows a relatively high heat transfer coefficient in the order of a few W/m·K, where a corresponding heat transfer coefficient may also amount up to 20 W/m·K and more.

The ring sheet 14 made of said composite ceramic material can be reshaped by applying pressure and/or heat. This means that the components resting on the surface of the sheet will slightly deform the upper side of the sheet upon application of a corresponding pressure or appropriately high heat, whereby an intimate contact is formed between component and sheet, the contact being distributed substantially uniformly over the whole contact surface of the two members.

The holding member 9 is formed as a pressing member that is fastened by a multitude of screws 19 arranged along its circumference 20 (see also FIG. 7) to the support member 5 in the area of the accommodating recess 6 and 7, respectively. The holding and/or pressing member 9 presses the components and optionally also the circuit carrier 8 with its underside 18 towards the surface 16 of the accommodating recess. To exert a corresponding pressure, the holding and/or pressing member 9 comprises press surfaces 22 (see also FIG. 4) in the area of the components 2, 3, 4. These contact the components 2, 3 and 4 from above and press the same firmly onto the ring sheet 14 upon tightening of the corresponding screws 19.

Furthermore, in its underside 21 the holding and/or pressing member 9 comprises a plurality of accommodating grooves 23 which are open towards the surface 16 of the accommodating recess 6. Said accommodating grooves 23 serve to accommodate particularly the connection wires 43 which extend between the corresponding component 2, 3 and 4, respectively, and a corresponding connection point on an upper side of the circuit carrier 8 and the board 13, respectively.

Furthermore, the holding and/or pressing member 9 comprises, on its underside 21, insertion openings 24 for accommodating orienting means 25. Said orienting means 25 are e.g. orienting pins 26 (see FIGS. 3 and 4), which are inserted into corresponding openings of a component 2, 3 and 4. They serve at least the temporary fixation of the corresponding components during assembly of the arrangement system of the invention on the holding and/or pressing member 9.

The orienting pins 26 are made of an electrically insulating plastic material, such as polyethylene or polyvinyl chloride and are relatively hard so as not to deform during insertion into one of the openings in the holding member 9 and component 2, 3 and 4, respectively.

Figure 4:
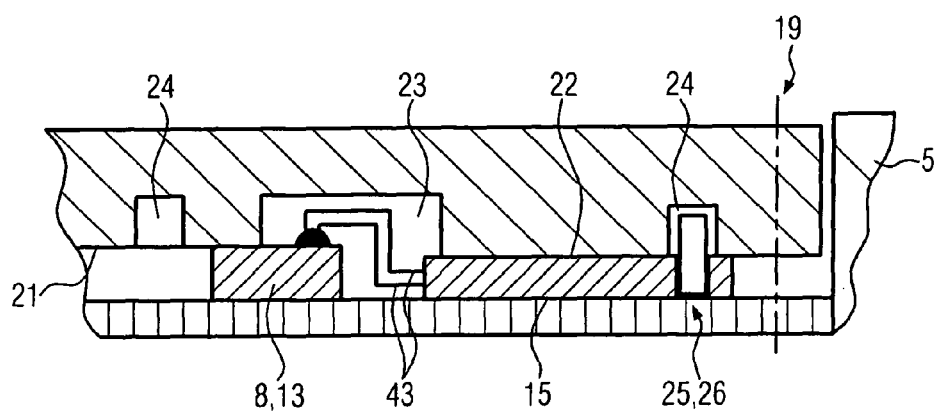
FIG. 4 is an enlarged view of a member of FIG. 3.

As can be seen in FIGS. 3 and 4 by analogy with FIGS. 2 and 1, respectively, the corresponding ring sheet 14 extends mainly in the area of the components 2, 3, 4 between the components and the surface 16 of the corresponding accommodating recess 6 and 7, respectively. The ring sheet 14 can here extend up to the inside 40 of the corresponding recess edge 17 and rest there in close contact.

According to FIG. 3 the holding and/or pressing member 9 can also serve as a cover member 30 for at least partly covering the corresponding accommodating recesses 6 so as to shield members in said accommodating recess in a puncture-proof way in relation to members in a further accommodating recess arranged thereabove (or in relation to the lid member) upon stacking, see FIG. 7.

To fasten the holding and/or pressing member 9 to the support member 5 in the interior of the accommodating recess 6 and 7, respectively, 40, 50 or even more screws are inserted into corresponding bores along a circumference of the holding member and screwed to the support member 5; see also the further embodiment according to FIG. 7. In FIG. 1, in the area of the ring sheet 14, analogous bores 39 are formed therein, through which the screws are passed for fastening the holding member to the support member.

The design in the area of the lower accommodating recess 7 according to FIG. 3 is analogous so as to arrange, see also the above explanations, a further converter module in the lower accommodating recess 7.

FIG. 4 shows part of FIG. 3 on an enlarged scale in order to illustrate especially the arrangement of the components between press surface 22 on the underside 21 of the holding and/or pressing member 9 and the ring sheet 14. At a place according to FIG. 4 a component is also held by means of the orienting pin 26 on the holding member 9. Corresponding orienting pins are in principle also useable for mounting the board 13 and the circuit carrier 8, respectively, on the holding member 9.

Figure 5:
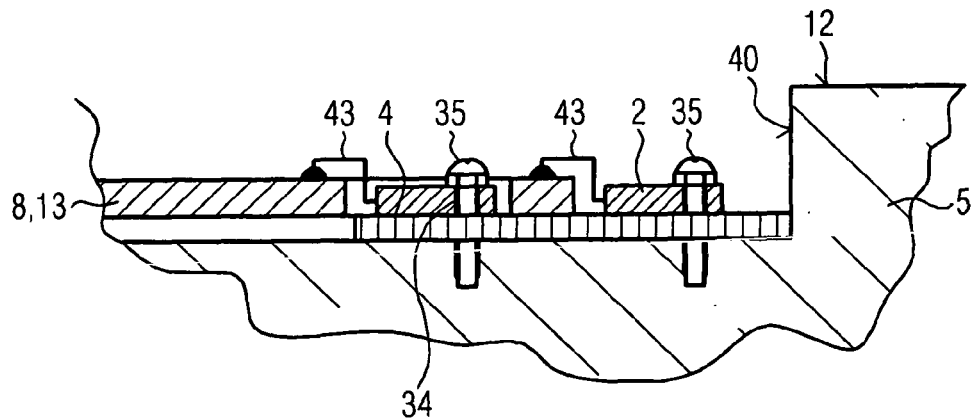
FIG. 5 is a top view by analogy with FIG. 4 for a second embodiment without holding member.

FIG. 5 shows a section by analogy with FIG. 3 for a further embodiment. A holding and pressing member 9 is not needed in FIG. 5.

In contrast to the embodiment shown in FIGS. 3 and 4, the components 2, 3 and 4 are not at least temporarily fastened to the holding member 9, but are directly fastened to the support member 5; see screws 35. To this end the corresponding components 2, 3 and 4 comprise screw-on bores 34 which are arranged in alignment with the corresponding bores in the ring sheet 14 and in the surface 16 of the accommodating recess 6 and 7, respectively. Moreover, circuit carrier 8 and components are arranged by analogy with the preceding figures.

FIG. 6 shows such a fastening according to FIG. 5 on an enlarged scale.

A sleeve 36 is arranged in the corresponding screw-on bore 34 of the component for electrical insulation. Said sleeve extends at least beyond the component 2 up and into the ring sheet 14. The sleeve 36 comprises a sleeve edge 37 resting on an upper side of the component, the sleeve edge 37 serving as a stop for a corresponding screw head of the screw 35. Furthermore, corresponding washers 45 are arranged between the screw head and the sleeve edge 37. The sleeve is made of a relatively hard plastic material and guarantees a corresponding electric strength in the area of the screw-on bore 34. At its free end facing the support member 5, the sleeve comprises a transition fit 44, which particularly facilitates insertion of the sleeve into the screw-on bore 34.

One screw is normally enough for one component, with accommodating grooves for accommodating the screw heads according to FIG. 5 being possibly provided in the underside 21 of the corresponding holding and/or pressing member 9, see also FIG. 3.

To adapt the ring sheet both to the dimensions of the corresponding accommodating recesses and to corresponding openings for screwing in the screws 35 according to FIGS. 5 and 6, said sheet may e.g. be cut with a water jet.

It is also conceivable that after having been fastened to the circuit carrier 8 and the board 13, respectively, the corresponding components are fastened by means of an adhesive material to the underside 21 of the holding and/or pressing member 9 prior to the insertion thereof into the accommodating recess.

Furthermore, it is conceivable to use a casting material as the insulating material 10 instead of the corresponding sheet

14. Said casting material is cast into the accommodating recess before insertion of corresponding further members, such as circuit carrier 8, components 2, 3 and 4, respectively, and holding and/or pressing members 9. After insertion particularly of the components and the circuit carrier 8 and a corresponding fixing of said members in the accommodating recess by the holding and/or pressing member 9, the casting material is cured. An example of such a casting material is epoxy resin. However, it usually turns out that such a casting material exhibits a lower electric strength and less heat transfer as compared with the corresponding ring sheet of ceramic material. Furthermore, in the case of a casting material it is not easily possible to disassemble the arrangement system 1 because after curing of the casting material the components and optionally also the circuit carrier are glued in the accommodating recess. A repair of the corresponding support member 5 is only possible by mechanical detachment of this gluing, whereby components and circuit carrier get normally damaged. Moreover, in the case of a ring sheet as the insulating material a corresponding vacuum degassing of the casting material is not needed, and corresponding curing periods for curing the casting material can also be dispensed with.

The corresponding casting material can also serve for fastening the holding and/or pressing member 9 which, when a ring sheet is used, is detachably fastened by means of the above-mentioned screw in the accommodating recess 6 and 7, respectively.

FIG. 7 shows a section analogous to FIG. 3 through a further embodiment. In this embodiment, an intermediate plate or intermediate ring 38 is additionally arranged between components 2, 3 and 4, respectively, and circuit carrier 8 or board 13. This ring serves both the fastening of the components and the fastening of the circuit carrier 8. These members can here be fastened by screwing, see also FIG. 6. Since the intermediate plate 38 is normally made from an electrically insulating material, a corresponding sleeve 36 according to FIG. 6 can optionally be omitted.

To fasten the corresponding intermediate plate 38 relative to the ring sheet 14, the holding and/or pressing member 9 is configured as a circumferential ring 32. Said ring extends substantially only along the circumference of the intermediate plate 38 between said plate and the inside 40 of the recess edge 17.

To hold and press the intermediate plate 38, the circumferential ring 32 comprises a radially inwardly projecting holding nose 46. Said nose presses from above onto the intermediate plate 38, thereby pressing it towards the ring sheet 14. In this embodiment the ring sheet 14 is also only arranged in the area of the components 2, 3 and 4 within the accommodating recess. In the area of the circuit carrier 8 and the board 13, respectively, such an arrangement is normally not needed because lower voltage values are here found.

A number of screws 19 serve to fasten the circumferential ring 32 by analogy with the preceding embodiments. To this end the circumferential ring 32 comprises a number of bores along its circumference, with 30, 40, 50 or even more bores being possibly provided. As a rule, these bores are equidistantly arranged along the circumference.

Intermediate rings 27 are arranged underneath the circumferential ring 32 between said ring and the ring sheet 40 in the area of the corresponding screws 19. Said rings are made from a relatively soft plastic material, such as polyurethane, so that the corresponding intermediate rings 17 are compressible while the circumferential ring 32 is being fastened.

As can further be seen in FIG. 7, several support members 5 can be arranged one on top of the other by stacking corresponding upper and bottom sides 11, 12 in the area of the recess edge 17. The corresponding accommodating recesses 6, 7 are closed in fluid-tight fashion between the various support members 5. It is only in the case of the respectively uppermost and lowermost support member 5 that upper and correspondingly lower accommodating recesses 6, 7 are additionally closable in a fluid-tight manner by a lid member 33.

The invention provides for a simple stacking of electrical/electronic components, such as are e.g. used for converter modules of voltage converter devices in the oil/natural gas production sector in so-called subsea trees in series connection, which stacking can be repaired and assembled easily. The electrical insulation of the corresponding components relative to the support member, which is grounded as a rule, is carried out by means of the corresponding ceramic sheet with simultaneously high heat transfer through the sheet. The waste heat of the components can thereby be discharged in a simple way via the support member over the outside 42 thereof directly to the environment, such as for example sea water. As a rule, the support member is here made of a sea water-resistant material, such as bronze or the like. Additional cooling devices are not needed due to subdivision into different devices for each accommodating recess and due to high heat transfer over the support member to the environment. Furthermore, the interior 47 of the arrangement system is filled with an inert atmosphere, such as relatively pure nitrogen.

Due to the corresponding arrangement and fastening of the various members a simple assembly of the arrangement system is enabled on the one hand, and repair without damage to corresponding components by exchanging the damaged part can be carried out on the other hand.

There is also the possibility of fastening the corresponding holding and/or pressing member 9, see for example the figures, not only in the area of its circumference by screwing to the support member. Instead of this, further screws may also be provided in the interior of the holding and/or pressing member.

Figure 8:
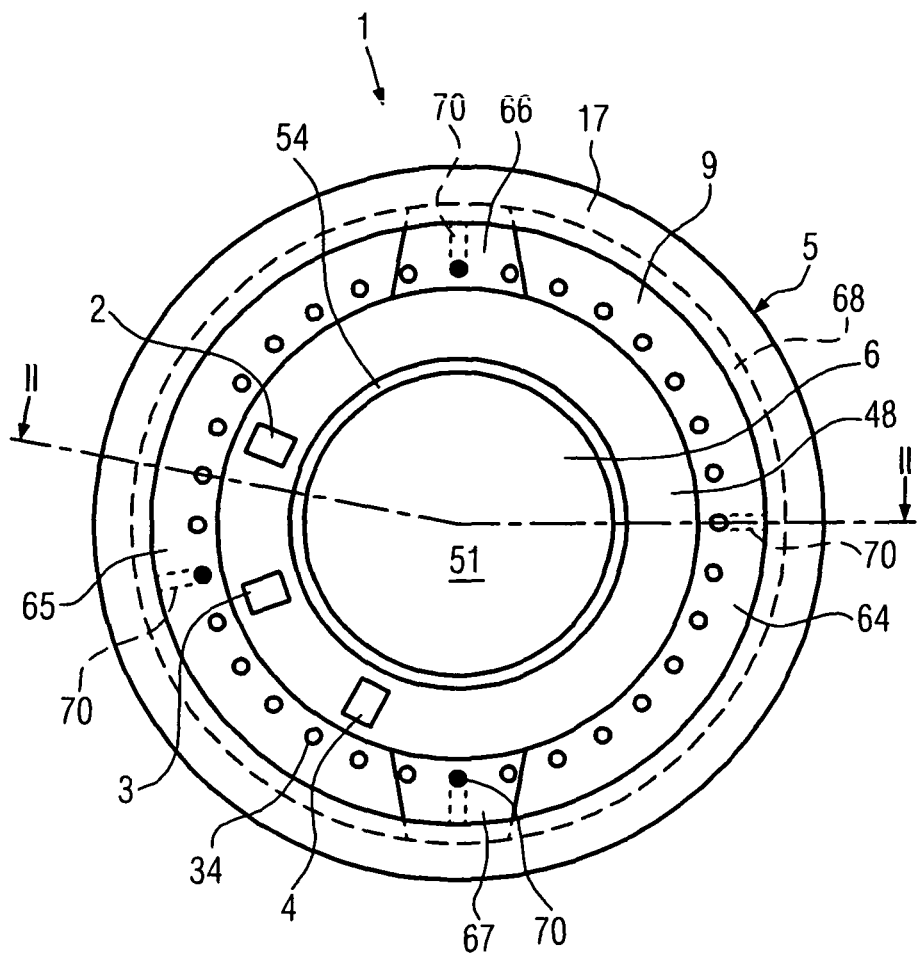
FIG. 8 is a top view on an arrangement system with support members and further members.

FIG. 8 is a top view on an arrangement system 1 with a circular support member 5 and an accommodating recess 6 formed therein. A number of said support members 5, see also FIG. 9 or FIGS. 10 and 11, can be stacked one on top of the other and are substantially of the same construction all the time.

The further members arranged in the accommodating recess 6 (see circuit carrier 8 according to FIG. 11, holding member 9 or component carrier 48) are also circular and inserted into the accommodating recess 6.

Figure 9:
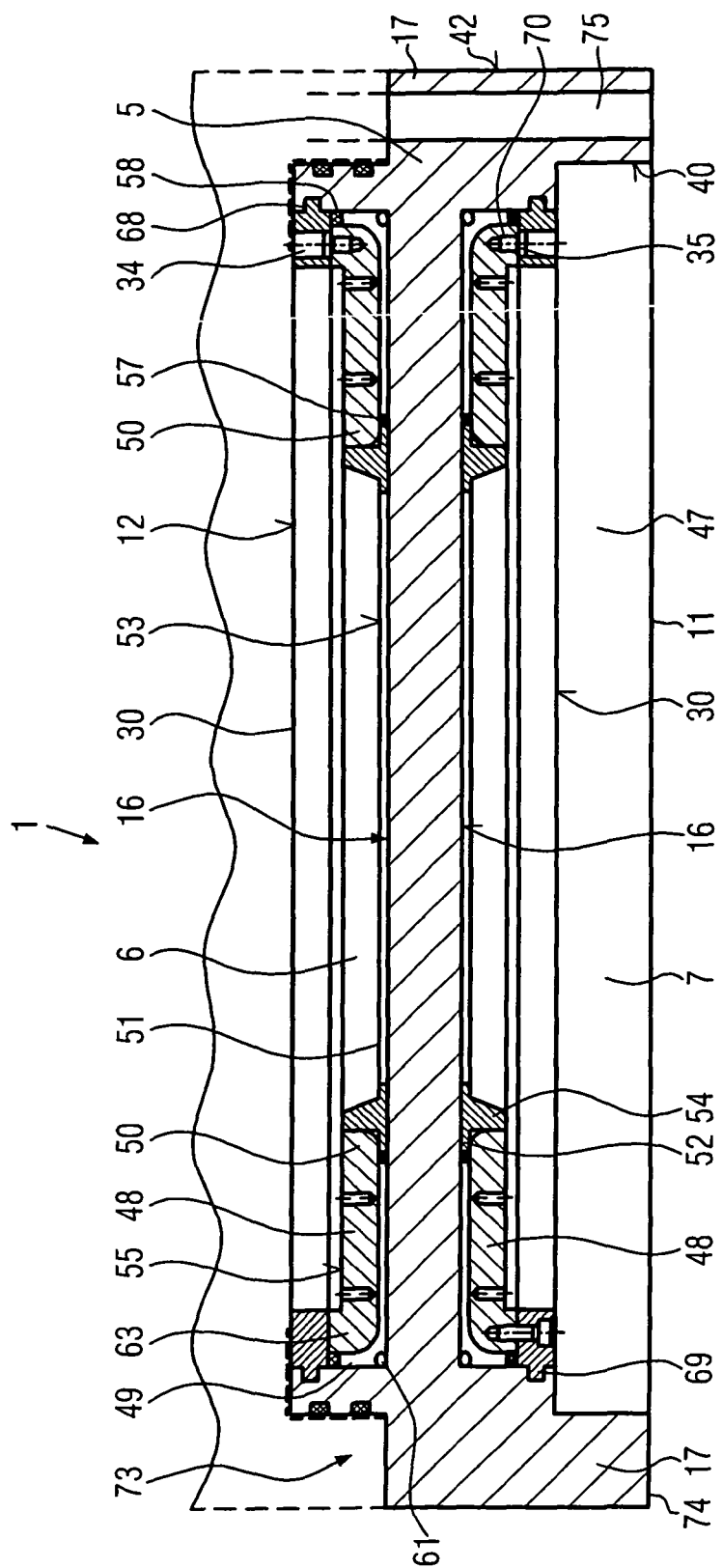
FIG. 9 is a section taken along line II-II of FIG. 8.

A bottom plate 51 is arranged centrally in the accommodating recess in the form of a bottom ring, said ring supporting the component carrier 48 from a radially interior side, see also FIG. 9. The component carrier 48 extends up to underneath the holding member 9, which can also be configured as a holding ring or a ring holding component 71; see also FIG. 10.

The holding member has formed therein a multitude of screw-on bores 34 by means of which the holding member 9 can be fastened with screws 35 (see also FIG. 9) particularly to the component carrier 48.

In the illustrated embodiment the holding member 9 has a multipart structure and particularly comprises two ring sections 64, 65 and two tapered ring sections 66, 67. The corresponding sections are each arranged to be diametrically opposite. The holding member 9 contains some of the corresponding bores 34 in combination with venting and/or filling openings 70 in the component carrier 48; see also the subsequent FIGS. 9 to 11.

The support member 5 comprises a recess edge 17 surrounding the corresponding accommodating recess 6 and 7, respectively; see also FIG. 9, in which near the upper free end thereof a plug groove 68 is designed in surrounding fashion. A corresponding plug projection 69 of the holding member 9 can be inserted into said groove.

The distribution of the venting and/or filling openings 70 is shown in FIG. 8 only by way of example, with more of said openings being possibly provided or also in another arrangement or also only in the ring sections 64 and 65.

FIG. 9 shows, on a top side of the component carrier 48, a number of components 2, 3 and 4 which e.g. represent a diode, a MOSFET or other electrical or electronic components.

FIG. 9 shows a section taken along line II-II of FIG. 8. A corresponding stacking of several support members 5 is shown in broken line. With such a stacking the corresponding recess edges 17 of support members 5 that are stacked one on top of the other are inserted into one another at least in part. This is accomplished via ends 73, 74 of the recess edges 17 facing one another. On at least one location and preferably on a plurality of locations in the recess edge 17, a corresponding stack bore 75 is configured to be spaced apart from the outside 42. After stacking of an adequate number of support members 5 it serves to interconnect said members.

In the area of the end 73 of the recess edge 17, surrounding sealing rings are arranged that protect the interior 47 of the whole arrangement system 1 against the penetration of e.g. seawater. The interior 47 is here also freed from oxygen, or the like, the interior being flushed for example with an inert gas, such as nitrogen, or the like, before the final closing of the arrangement system, and said gas is then enclosed in the interior.

Every support member 5 comprises an upper and a lower accommodating recess 6, 7 in a corresponding manner on the upper side 12 and lower side 11, respectively. The bottom ring 51 is arranged centrally in each accommodating recess 6, 7. Said ring serves along its ring circumference 52 to support an inner radial end section 50 of the component carrier 48. For external abutment of a free end of the component carrier 48 a contact nose 54 projects from the upper side 53 of the bottom ring 51.

Figure 11:
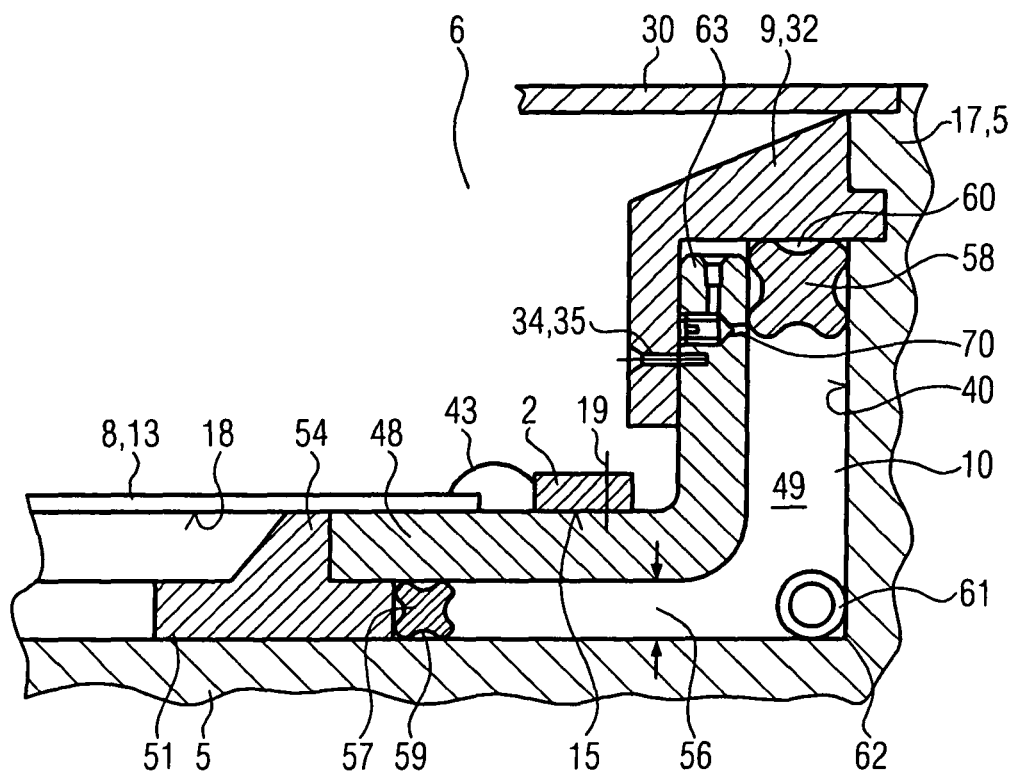
FIG. 11 is an enlarged illustration analogous to FIG. 10 for a further embodiment.

The component carrier 48 extends spaced apart at a distance 56 from the surface 16 of the corresponding accommodating recess 6, 7 and is provided on its radially outer end section 63, see particularly FIG. 11, with a member extending substantially in parallel with the inside 40 of the recess edge 17. An accommodating chamber 49 is formed between the component carrier 48 and the support member 5 through this spaced-apart arrangement. An insulating material 10 is arranged in said chamber, see particularly FIG. 11. Said material serves the electrical insulation particularly of the components 2, 3, 4 arranged on the component carrier 48 and serves at the same time to transfer heat towards the support member 5. The support member 5 is normally formed from a seawater-resistant or anticorrosive material such as bronze, or the like, and serves to emit the corresponding heat directly to the seawater.

However, the insulating material 10 is also to guarantee an electrical insulation of the components in a reliable manner so as to ensure an adequate dielectric strength in relation to the support member 5, which is in principle grounded above seawater.

A plurality of bores are provided in the component carrier 48 that, see also FIG. 11, serve to detachably secure the corresponding components 2, 3 and 4.

At its radially outwardly located end section 63, the component carrier 48, which is formed as a ring component, is detachably fastened by means of the holding member 9 to the support member 5. Such fastening is normally accomplished through a multitude of screws 35 that are inserted through corresponding screw-on bores 34 and fastened to the component carrier 48. For electrical insulation holding member 9 and bottom ring 51 are made of a plastic material, such as polyurethane or the like.

A number of venting and/or filling openings 70 are arranged in the component carrier 48. These openings are e.g. closeable by means of screw 35 from the side of the holding member 9.

Figure 10:
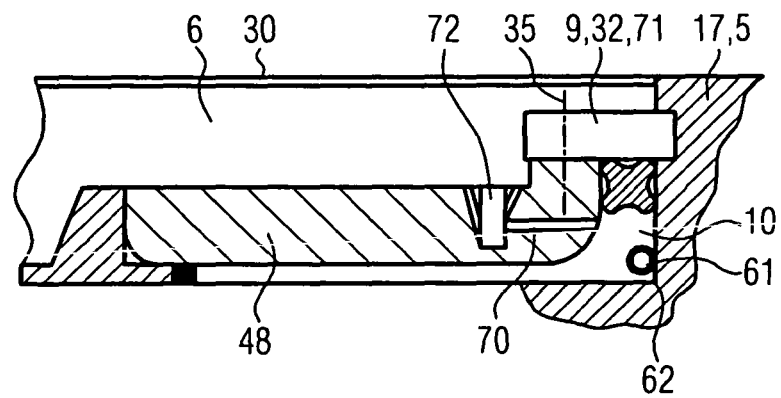
FIG. 10 is an enlarged illustration of an edge section of FIG. 9 for a further embodiment.

There is also the possibility, see FIG. 10, that such a venting and filling opening can be closed from the side of the component carrier 48 or the upper side 55 thereof. This is done in FIG. 10 e.g. by a special self-sealing screw 72, which may comprise a conically formed thread.

The holding member 9 is normally configured as a holding ring. Said ring comprises a surrounding plug type projection 69 that projects radially outwards towards the recess edge 17. It is inserted into a corresponding plug groove 68 formed in surrounding fashion in the recess edge 17.

To close the corresponding accommodating recess, said recess may comprise a covering member 30 which is particularly arranged between accommodating recesses 16, 17 of support members 5 stacked one upon the other, with the recesses facing each other.

The uppermost and the lowermost support members 5 in such a stacked configuration can be closed by a separate lid member in fluid-tight fashion particularly with respect to the surrounding seawater.

The accommodating chamber 49 between component carrier 48 and support member 5 serves to accommodate the corresponding insulating material 10. In one embodiment said material may be a paste or liquid with corresponding properties. The properties are, in particular, adequate thermal conductivity and adequate electric strength, see also the above observations. To vary one of said properties in case of need, the pasty or liquid base material of the insulating material may have added an especially mineral additive. Said additive can serve to increase the thermal conductivity and/or to increase the electric strength.

Said additive or also a further solid can be added to the base material also for varying the viscosity. For instance, the corresponding insulating material can be made more or less "pasty", depending on the solids or additive content. The corresponding insulating material can be arranged in the accommodating recess 6, 7 prior to insertion of the component carrier 48. After a corresponding arrangement of the component carrier 48 and optionally an additional circuit carrier 8, see FIG. 11, the holding ring or holding member 9 is fastened, and holding member 9 and component carrier 48 are screwed together.

Next to the corresponding insulating material 10, a hose ring 61 is arranged inside the accommodating chamber 49. Said ring is hollow in its interior and made of a relatively soft material. Said hose ring particularly serves volume and/or pressure compensation upon corresponding expansions of the insulating material.

Furthermore, sealing rings 57, 58 are arranged in the accommodating chamber 49 at its corresponding ends 58, 60. These rings may have a round or angular and particularly square cross-section. Such sealing rings are also called O-rings.

FIG. 10 shows a further embodiment of an arrangement system, particularly in the area of a recess edge 17. Said embodiment differs from the one according to FIG. 9 particularly in the form of the holding member 9, which is here configured as a flat ring holding component 71. In FIG. 10 said component has an approximately rectangular cross-section and is fastened by means of the corresponding screw 35 to the free end of the component carrier 48 which is oriented upwards in the direction of the cover member 30.

Holding member 9, see also the remaining figures, component carrier 48, support member 5 and also bottom ring 51 define the accommodating chamber 49.

In FIG. 10, the corresponding venting and/or filling opening 70 extends horizontally between accommodating chamber 49 and a bore in the component carrier 48. Said bore is oriented towards the surface 16 of the accommodating recess 6. In said bore a particularly self-sealing screw 72 with conical thread is arranged for closing the venting and/or filling opening 70.

FIG. 11 shows a further embodiment by analogy with FIG. 10. Said embodiment differs particularly from the embodiment according to FIG. 9 or 10 by another shape of the holding member 9. Said member extends in FIG. 11 from the inside 40 of the recess edge 17 radially inwards and grips over the end section 63 of the component carrier 48. On the outside of the component carrier 48 opposite the accommodating chamber 49, the holding member 9 is detachably secured by means of the corresponding screws 35 to said carrier.

Otherwise, the holding member 9 according to FIG. 11 comprises a surrounding plug projection 69 which is inserted into a corresponding plug groove 61 of the recess edge 17.

Above the holding member 9 the cover member 30, see also FIG. 10, is shown at least in part.

FIG. 11 additionally shows in part a circuit carrier 8 which may be configured in the form of a board 13. Said carrier is connected via corresponding connection wires 43 to the components 2, 3 and 4; see also FIG. 8. It is also possible to omit such a separate circuit carrier 8, and the corresponding circuits may here be arranged on the component carrier 48. The material of circuit carrier 8 and component carrier 48 is substantially identical with that of the cover member 30 and is particularly a fiber composite made of paper and phenolic plastic.

According to FIG. 11 the corresponding components 2, 3 and 4 are fastened by means of screws 19 to the component carrier 48. The fastening operation can also be carried out by attachment, gluing, or the like, in the area of an underside 15 of the component.

The other members in FIG. 11 and also in FIG. 10 correspond substantially to those shown in FIG. 9, and like reference numerals are each time used for like components. Partly, the corresponding members are only explained in more detail in connection with one figure.

FIG. 11 shows the corresponding venting and/or filling opening 70 in the end section 63 of the component carrier 48. Said opening 70 is here closed by means of a screw that is screwed up and into the venting and/or filling opening 70 from the side of the holding member 9 for corresponding closing. The opening 70 shows a corresponding end section that is directed towards the free end of the component carrier 48.

The sealing rings 57 and 58 are each arranged at ends 59, 60 of the accommodating chamber 49. The corresponding sealing rings 57, 58 can be introduced by mounting on the bottom ring 51 and on the holding member 9, respectively, said rings being e.g. directly glued to this member.

The accommodating chamber 49 can be filled prior to the arrangement of the component carrier 48, and excessive insulating material 10 can be squeezed out of the accommodating chamber 49 in a corresponding way during mounting of the component carrier 48. The insulating material can also be arranged in the accommodating chamber via the venting and/or filling opening 70. A combination of the two arrangement methods is also possible.

In the embodiment according to FIG. 11 the distance 56 between component carrier 48 and surface 16 of the accommodating recess 6 and 7, respectively, is constant at least in the area of said surface 16. The distance can e.g. be larger between component carrier 48 and inside 40 of the recess edge 17. The hose ring 61 is arranged in the area of a corresponding connection edge 62 between accommodating recess 6, 7 and recess edge 17.

Figure 12:
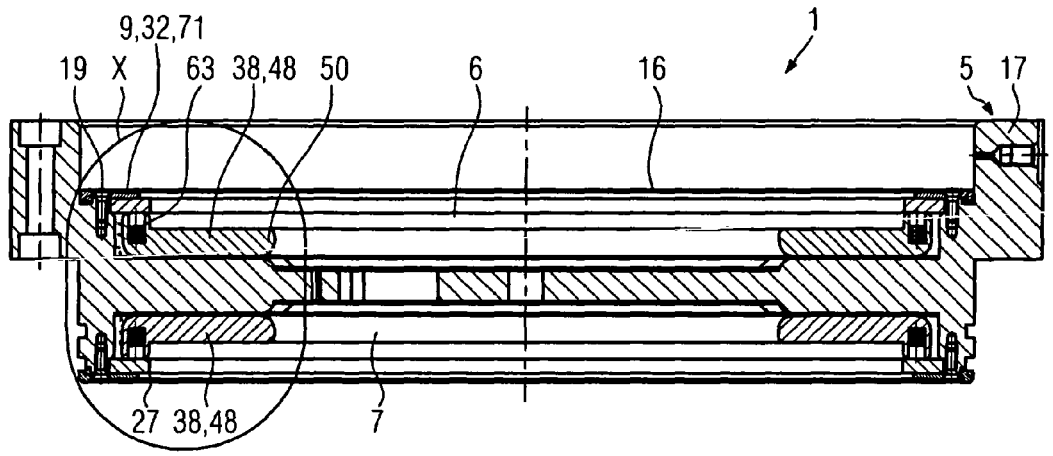
FIG. 12 is a section analogous to FIG. 9 through a further embodiment.

FIG. 12 shows a section according to FIG. 9 through a further embodiment of the arrangement system 1 according to the invention. Like members are provided with like reference numerals and, as far as their description is concerned, reference is made to the description of the preceding figures In the further embodiment shown in FIG. 12, the intermediate ring and component carrier 38, 48, respectively, is fastened by means of an intermediate ring 27. Said intermediate ring 27 is held on the recess edge 17 by means of the holding and/or pressing member 9, which can also be designed as circumferential ring 2 or holding ring 71, respectively. This is particularly carried out by pressing one end 79 of the intermediate ring 27 onto a stepped projection 81 of the recess edge 17, which is configured to project radially inwards and in surrounding fashion. With a corresponding screwing operation, see also FIG. 9, the intermediate ring 27 holds the intermediate ring and component carrier 38, 48, respectively, in position. However, the intermediate ring and the component carrier 38, 48, respectively, are movable to some extent for compensating for thermal differences in neighboring components.

The intermediate ring and the component carrier 38, 49, respectively, is spaced apart from the inside 14 of the recess edge 17 with formation of an accommodating chamber 49. In this chamber an insulating material 10, such as silicone, is arranged. The insulating material 10 can fill the whole accommodating chamber. The insulating material 10 can particularly be configured as a coating on the inside 40 of the recess edge 17 and/or the intermediate ring and component carrier 38, 48, respectively.

The intermediate ring 27 is also made from an insulating material, such as aluminum oxide.

The intermediate ring and the component carrier 38, 48, respectively, is insulated from the upper side of the accommodating recess, with an insulating material layer/sheet 14 being arranged at least in one layer between said members. In the illustrated embodiment, see also FIG. 13, two layers of insulating material sheets 14 are arranged.

Figure 13:
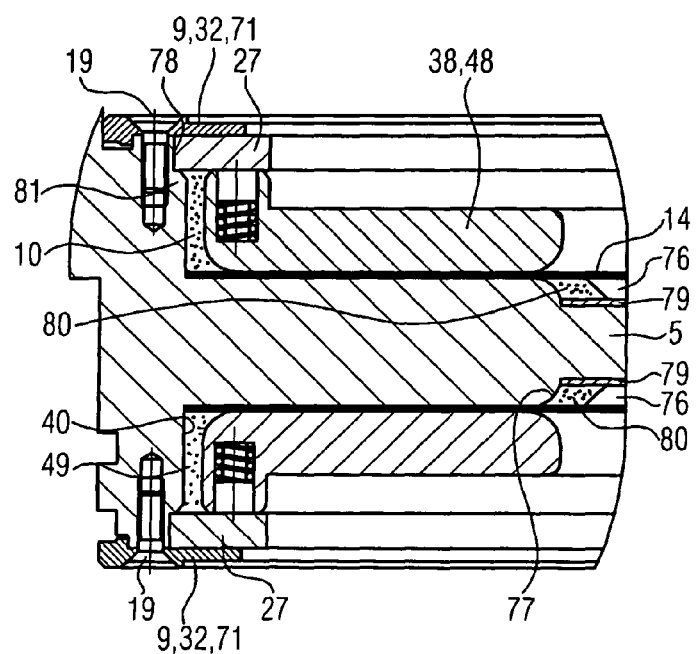
FIG. 13 is an enlarged illustration of an edge portion of FIG. 12.

FIG. 13 shows the area "X" of FIG. 12 on an enlarged scale. As can particularly be seen, the insulating material 10 is arranged not only in the corresponding accommodating chamber, but also underneath the two insulating material sheets 14 in the area of a rebound recess 76. Said recess is arranged approximately centrally in the accommodating recess 6, 7; see also FIG. 12. The rebound recess 76 serves to arrange further members, such as e.g. a fiber glass plate 79, aramid glass plate, a woven plate or the like. A ring insulation material 80 is arranged between said plate and the insulating material sheets particularly along an edge 77 of the rebound recess 76. It should be noted in connection with the embodiment according to FIGS. 12 and 13 that the insulating material 10 can also be dispensed with because the spaced arrangement and mounting of intermediate ring and component carrier 38, 48, respectively, already provide for a relatively high electric strength of the accommodating chamber. Furthermore, it should be noted with respect to the insulating material 10 that said material serves not only the thermal insulation or electrical insulation, but also as a vibration damping material for the intermediate ring and component carrier 38, 48, respectively, Otherwise, reference is made to the preceding description also in connection with the embodiment according to FIGS. 12 and 13.

The invention claimed is:

1. An arrangement system for a plurality of electrical/electronic components, particularly of a voltage converter device of a power supply system for use in oil/natural gas production, comprising:
   at least one support member which is provided at least on one side with a surrounded accommodating recess;
   a circuit carrier which is arranged in and supported by the accommodating recess and electrically connected to the components and comprises component openings and/or cutouts such that the components are not arranged directly on the circuit carrier;
   a holding member which fixes the circuit carrier and/or the components in the recess; and
   wherein an insulating material is arranged only in and supported by the recess at least in part between the circuit carrier and the support member and between the components and the support member.

2. The arrangement system according to claim 1, wherein the support member is provided at both sides with accommodating recesses arranged in lower and upper side.

3. The arrangement system according to claim 1, wherein said system has a substantially circular cross-section.

4. The arrangement system according to claim 1, wherein the accommodating recess can be closed in fluid-tight fashion.

5. The arrangement system according to claim 1, wherein the components are electrically connected to the circuit carrier.

6. The arrangement system according to claim 1, wherein the insulating material is an electrically insulating sheet.

7. The arrangement system according to claim 6, wherein the sheet is configured as a ring sheet.

8. The arrangement system according to claim 6, wherein the sheet is arranged at least in part between underside of the circuit carrier and/or undersides of each component and surfaces of the accommodating recess.

9. The arrangement system according to claim 6, wherein the sheet is formed from a material, particularly a composite ceramic material, which can be reshaped at least in part by pressure and/or heat.

10. The arrangement system according to claim 1, wherein the holding member is a pressing member connected to the support member by screwing.

11. The arrangement system according to claim 10, wherein the holding member is ring-shaped.

12. The arrangement system according to claim 1, wherein a plurality of screws are arranged for fastening the holding member to the support member particularly along a circumference of the holding member.

13. The arrangement system according to claim 1, wherein the insulating material is arranged in the area of the components.

14. The arrangement system according to claim 1, wherein the holding member comprises a plurality of press surfaces and/or accommodating recesses on its underside facing the component.

15. The arrangement system according to claim 1, wherein the holding member comprises at least one insertion opening for an orienting means for orienting a component.

16. The arrangement system according to claim 15, wherein the orienting means comprises an electrically insulating orienting pin preferably made of a plastic material.

17. The arrangement system according to claim 1, wherein the holding member is configured as a cover member covering the accommodating recess at least in part.

18. The arrangement system according to claim 1, wherein a lid member that is closing the accommodating recess in fluid-tight fashion is arranged above the circuit carrier and/or the holding member.

19. The arrangement system according to claim 1, further comprising a number of support members with corresponding accommodating recesses and further members arranged therein are adapted to be stacked.

20. The arrangement system according to claim 1, wherein the support members are stackable by means of the recess edges surrounding the accommodating recesses.

21. The arrangement system according to claim 1, wherein the support member in the area of the recess edge has substantially the shape of a lying T when viewed in cross section.

22. The arrangement system according to claim 1, wherein said system contains a substantially inert atmosphere in its interior.

23. The arrangement system according to claim 1, wherein the support member comprises an upper and a lower accommodating recess in the upper and lower side.

* * * * *